(12) United States Patent
Park et al.

(10) Patent No.: US 10,991,637 B2
(45) Date of Patent: Apr. 27, 2021

(54) WAFER-LEVEL CHIP-SCALE PACKAGE INCLUDING POWER SEMICONDUCTOR AND MANUFACTURING METHOD THEREOF

(71) Applicant: MagnaChip Semiconductor, Ltd., Cheongju-si (KR)

(72) Inventors: Myung Ho Park, Cheongju-si (KR); Beom Su Kim, Cheongju-si (KR); Sun Hwan Kim, Incheon (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/734,688

(22) Filed: Jan. 6, 2020

(65) Prior Publication Data

US 2020/0144145 A1 May 7, 2020

Related U.S. Application Data

(62) Division of application No. 15/398,453, filed on Jan. 4, 2017, now Pat. No. 10,573,571.

(30) Foreign Application Priority Data

Jun. 9, 2016 (KR) .................. 10-2016-0071879

(51) Int. Cl.
*H01L 21/78* (2006.01)
*H01L 23/31* (2006.01)
(Continued)

(52) U.S. Cl.
CPC ........ *H01L 23/3114* (2013.01); *H01L 21/561* (2013.01); *H01L 21/823418* (2013.01); *H01L 21/823487* (2013.01); *H01L 22/14* (2013.01); *H01L 23/482* (2013.01); *H01L 27/088* (2013.01); *H01L 29/45* (2013.01); *H01L 24/06* (2013.01); *H01L 24/13* (2013.01); *H01L 24/14* (2013.01); *H01L 24/16* (2013.01); *H01L 24/45* (2013.01); *H01L 27/0255* (2013.01); *H01L 29/7397* (2013.01); *H01L 29/7802* (2013.01);
(Continued)

(58) Field of Classification Search
None
See application file for complete search history.

(56) References Cited

U.S. PATENT DOCUMENTS 8,563,361 B2    10/2013  Xue et al.
2009/0315175 A1  12/2009  Okada et al.
(Continued)

*Primary Examiner* — Joseph C. Nicely
*Assistant Examiner* — Lamont B Koo
(74) *Attorney, Agent, or Firm* — NSIP Law

(57) ABSTRACT

A wafer-level chip-scale package includes: a power semiconductor comprising a first semiconductor device formed on a semiconductor substrate, and a second semiconductor device formed on the semiconductor substrate; a common drain electrode connected to the first semiconductor device and the second semiconductor device; a first source metal bump formed on a surface of the first semiconductor device; and a second source metal bump formed on the surface of the second semiconductor device; wherein the first source metal bump, the common drain electrode, and the second source metal bump form a current path in an order of the first source metal bump, the common drain electrode, and the second source metal bump.

10 Claims, 11 Drawing Sheets

(51) Int. Cl.
*H01L 27/088* (2006.01)
*H01L 29/45* (2006.01)
*H01L 21/8234* (2006.01)
*H01L 21/66* (2006.01)
*H01L 23/482* (2006.01)
*H01L 21/56* (2006.01)
H01L 23/00 (2006.01)
H01L 29/78 (2006.01)
H01L 27/02 (2006.01)
H01L 29/739 (2006.01)

(52) U.S. Cl.
CPC ...... *H01L 29/7813* (2013.01); *H01L 29/7816* (2013.01); *H01L 29/7827* (2013.01); *H01L 2224/0401* (2013.01); *H01L 2224/0508* (2013.01); *H01L 2224/05082* (2013.01); *H01L 2224/05083* (2013.01); *H01L 2224/05084* (2013.01); *H01L 2224/05572* (2013.01); *H01L 2224/05584* (2013.01); *H01L 2224/0603* (2013.01); *H01L 2224/06051* (2013.01); *H01L 2224/1403* (2013.01); *H01L 2224/16237* (2013.01); *H01L 2224/32245* (2013.01); *H01L 2224/45124* (2013.01); *H01L 2224/45144* (2013.01); *H01L 2224/45147* (2013.01); *H01L 2224/48095* (2013.01); *H01L 2224/48106* (2013.01); *H01L 2224/48145* (2013.01); *H01L 2224/48247* (2013.01); *H01L 2224/73265* (2013.01); *H01L 2224/81193* (2013.01); *H01L 2224/94* (2013.01); *H01L 2924/01022* (2013.01); *H01L 2924/01023* (2013.01); *H01L 2924/01028* (2013.01); *H01L 2924/01029* (2013.01); *H01L 2924/01047* (2013.01); *H01L 2924/07025* (2013.01); *H01L 2924/10253* (2013.01); *H01L 2924/13055* (2013.01); *H01L 2924/13091* (2013.01); *H01L 2924/141* (2013.01); *H01L 2924/17747* (2013.01); *H01L 2924/181* (2013.01); *H01L 2924/2064* (2013.01); *H01L 2924/20641* (2013.01)

(56) References Cited

U.S. PATENT DOCUMENTS

| | | |
|---|---|---|
| 2011/0024834 A1 | 2/2011 | Hull et al. |
| 2012/0104580 A1 | 5/2012 | Feng et al. |
| 2012/0313162 A1* | 12/2012 | Matsuda ............ H01L 21/28568 257/330 |
| 2013/0210195 A1* | 8/2013 | Xue .................... H01L 23/3157 438/112 |
| 2013/0320454 A1 | 12/2013 | Suzuki et al. |
| 2014/0133104 A1 | 5/2014 | Delgado et al. |
| 2014/0151794 A1 | 6/2014 | Lotfi et al. |
| 2014/0315350 A1* | 10/2014 | Xue ....................... H01L 24/11 438/110 |
| 2016/0035653 A1 | 2/2016 | Niu et al. |
| 2017/0033060 A1 | 2/2017 | Niu et al. |

* cited by examiner

WAFER-LEVEL CHIP-SCALE PACKAGE INCLUDING POWER SEMICONDUCTOR AND MANUFACTURING METHOD THEREOF

CROSS-REFERENCE TO RELATED APPLICATIONS

This application is a divisional application of U.S. application Ser. No. 15/398,453, filed Jan. 4, 2017, which claims the benefit under 35 USC 119(a) of Korean Patent Application No. 10-2016-0071879 filed on Jun. 9, 2016 in the Korean Intellectual Property Office, the entire disclosure of which is incorporated herein by reference for all purposes.

BACKGROUND

1. Field

The following description relates to a wafer-level chip-scale package (WLCSP) including a power semiconductor, and a method of manufacturing a WLCSP including a power semiconductor.

2. Description of Related Art

One of the major trends in the current semiconductor industry is to minimize the size of a semiconductor device. The demand for miniaturization is particularly high in the semiconductor device package ("package") industry. For example, a package includes an integrated chip and a fine-pattern printed circuit sealed with plastic resin or ceramic material, and is designed to be mounted to practical electronic devices. A conventional package was much larger than the integrated circuit chip contained in the package. Therefore, minimizing the size of a package down to the size of a chip contained in the package was one of the primary objectives of package technicians. A package in having a size substantially the same as a size of a chip contained in the package is referred to as a chip-scale package or a chip-size package.

A manufacturing method of a wafer-level chip-scale package (WLCSP) differs from manufacturing methods of other conventional semiconductor packages. For example, in other conventional package manufacturing methods, packages are assembled based on individual chip units. In contrast, in WLCSP manufacturing methods, packages are uniformly assembled and manufactured at the level of a semiconductor wafer. A WLCSP therefore has a good electrical qualities and can be produced at a low price.

Many elements used for smart phones have been fabricated by implementing WLCSPs, and the development of such elements is trending towards providing high speed operations and a compact size. Wafer-level packaging can economize production cost in mass production, since packaging is uniformly performed at the wafer level. However, since a WLCSP uses wire bonding for the purpose of a connection between a semiconductor substrate and a lead frame, the wire generates regular electric resistance, which results in a great amount of on resistance between sources. Also, the fact that a WLCSP employs a thick silicon semiconductor substrate and a solder ball works against minimization of the package.

It is therefore desirable to provide a solution for the above-mentioned and other technical issues in WLCSPs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a wafer-level chip-scale package includes: a power semiconductor including a first semiconductor device formed on a semiconductor substrate, and a second semiconductor device formed on the semiconductor substrate; a common drain electrode connected to the first semiconductor device and the second semiconductor device; a first source metal bump formed on a surface of the first semiconductor device; and a second source metal bump formed on the surface of the second semiconductor device, wherein the first source metal bump, the common drain electrode, and the second source metal bump form a current path in an order of the first source metal bump, the common drain electrode, and the second source metal bump.

The first semiconductor device may further include first source pads and first gate pads. The second semiconductor device may further include second source pads and second gate pad. The first source pad and the second source pad may be respectively connected to the first source bump and the second source bump. The first source pads and the second source pads are physically separated.

The wafer-level chip-scale package may further include: a back metal layer formed on a bottom of the power semiconductor; a first metal layer formed on the bottom of the power semiconductor; and a second metal layer formed on the bottom of the power semiconductor, wherein the first metal layer and the second metal layer form the common drain electrode.

The first metal layer may include copper or silver, and a thickness of the first metal layer may be between 5 um and 30 um.

The second metal layer may include nickel.

The first source metal bump and the second source metal bump may each include a solderable metal layer.

The power semiconductor may include a dual n-channel.

The first semiconductor device and the second semiconductor device may each include a trench MOSFET device.

The wafer-level chip-scale package may further include a gate control semiconductor device disposed on the power semiconductor.

A resistance between the first source bump and the second source bump may be less than 10 mΩ when a power switch for the power semiconductor is in an on configuration.

In another general aspect, a method to manufacture a wafer-level chip-scale package includes: preparing a power semiconductor including a first semiconductor device disposed on a semiconductor substrate and a second semiconductor device disposed on the semiconductor substrate; forming a first source metal bump and a second source metal bump on the power semiconductor; forming a recessed area and a rim disposed around the recessed area by polishing a bottom of the semiconductor substrate; forming a common drain electrode, connected to the first semiconductor device and the second semiconductor device, by depositing a first metal layer on the recessed area; and flattening the bottom of the semiconductor substrate by trimming the rim.

The method may further include testing the power semiconductor before the trimming of the rim.

The method may further include forming a second metal layer on the first metal layer, wherein the first metal layer includes copper and the second metal layer includes nickel.

In another general aspect, a method to manufacture a wafer-level chip-scale package includes: preparing a power semiconductor by disposing a first semiconductor device and a second semiconductor device on a substrate; forming a recessed area on a surface of the substrate and a rim surrounding the recessed area, by polishing the surface; and forming a common drain electrode, connected to the first semiconductor device and the second semiconductor device, by depositing a first metal layer on the recessed area.

The method may further include depositing a back metal layer on the recessed area prior to the depositing of the first metal layer on the recessed area.

The method may further include depositing a second metal layer on the first metal layer.

The back metal layer may include nickel-vanadium. The first metal layer may include one of copper and silver. The second metal layer may include nickel.

Other features and aspects will be apparent from the following detailed description, the drawings, and the claims.

DETAILED DESCRIPTION

Figure 1:
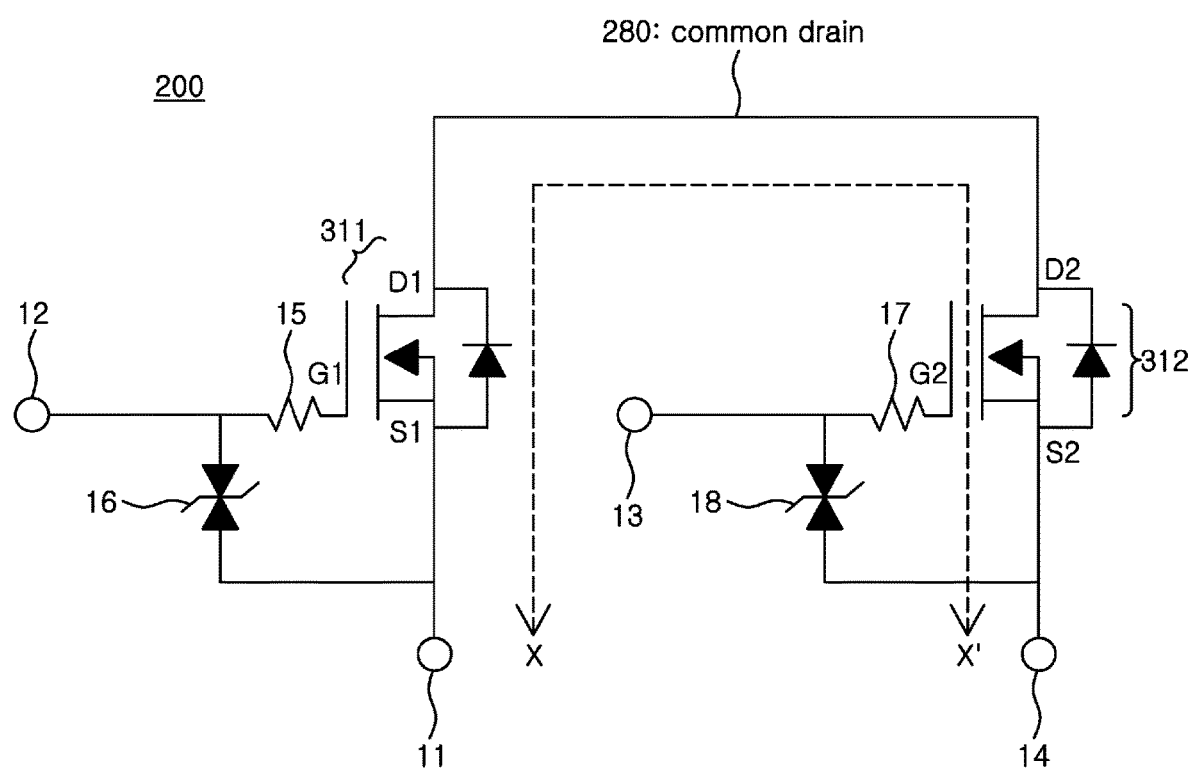
FIG. 1 is a circuit diagram illustrating a current path of a power semiconductor of a wafer-level chip-scale package having a dual n-channel, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

According to embodiments disclosed herein, a wafer-level chip-scale package and a method of manufacturing a wafer-level chip-scale package resist warpage and damage from handling of a wafer, while providing the package with a semiconductor substrate having a reduced thickness. The resistance to warpage and damage is achieved by reducing the thickness of the semiconductor substrate by partially polishing a bottom part of the semiconductor substrate where a chip of the semiconductor substrate is not formed, and by eliminating an unpolished part of the bottom of the semiconductor substrate after finishing a final test of semiconductor elements formed on the semiconductor substrate.

Also, the disclosed embodiments provide an electrical path, and exhibit a low on resistance and power-saving effects by reducing the thickness of the silicon wafer and depositing a first metal layer of regular thickness on the substrate to serve as a common drain electrode. Additionally, by depositing a second metal layer on a surface of the first metal layer, oxidation of the first metal layer is prevented while retaining the visibility of markings on the first metal layer.

Also, the disclosure can be applied to a MOSFET which demands a low on resistance by providing a thin wafer-level chip-size package used for a vertical structured semiconductor device, and can also be applied to various power semiconductor modules including a protection circuit module (PCM).

Furthermore, reducing an overall thickness of a wafer-level chip-size package in accordance with the embodiments disclosed herein enables a multi-chip package (MCP) to be easily produced.

FIG. 1 illustrates a circuit of a power MOSFET device, which is a dual n-channel power semiconductor 370 (FIG. 2) included in a wafer-level chip-scale package 200, according to an embodiment. As illustrated in FIG. 1, in the circuit, a first semiconductor device 311 and a second semiconductor device 312 of the power semiconductor 370 have a tied configuration using a common drain electrode 280. The first semiconductor device 311 has an n-type first channel, and includes a first source electrode S1, a first drain electrode D1, and a first gate electrode G1. The second semiconductor device 312 has an n-type second channel, and includes a second source electrode S2, a second drain electrode D2, and a second gate electrode G2. The first source electrode S1 and the second source electrode S2 are electrically separated. The first drain electrode D1 and the second drain electrode D2 are electrically connected by the common drain electrode 280. The first and the second semiconductor devices 311 and 312 may use a semiconductor which is used for a power management integrated circuit (PMIC). For instance, a vertical type trench MOSFET device or IGBT device may be used. Additionally, a power CMOS device or LDMOS device may be used. It is desirable that the semiconductor used in the semiconductor devices 311 and 312 have a low resistance. More specifically, since the first and second semiconductor devices 311 and 312 are linked together, it is desirable to lower the resistance of the common drain electrode 280. Therefore, it is possible to keep the resistance generated between the first source electrode S1 and the second source electrode S2 below 10 mΩ when a power switch for the power semiconductor 370 is turned on.

The dotted arrow X-X' illustrates a current path when the power semiconductor 370 is turned on. As illustrated in FIG. 1, when the first and second semiconductor devices 311 and 312 are turned on, the current path X-X', in which current flows from the first source electrode S1 to the first drain electrode, to the common drain electrode 280, to the second drain electrode D2, and then to the second source S2 electrode, is formed. As circumstances demand, it is possible to induce the current path X-X' in a direction opposite the direction illustrated. In such a case, the current path X-X' flows from the second source electrode S2 to the second drain electrode D2, to the common drain electrode 280, to the first drain electrode D1, and then to the first source electrode S1.

It is advantageous to be able to generate the current path X-X' bilaterally, as described. For example, the wafer-level chip-scale package 200 including the bilateral current path X-X' has an advantage of increasing the life of battery of handheld devices.

It can be appreciated from the description above that the common drain electrode 280 constitutes a longest portion of the path X-X' to be passed. In this respect, it is important to lower the resistance of the common drain electrode 280. For example, it is desirable for the resistance between the first source electrode S1 and the second source electrode S2 to be below 10 mΩ, or even below 5 mΩ, when the switch is turned on.

A TVS (transient voltage suppression) diode is formed between the gate input lead 12, 13 and the source input lead 11, 14, respectively. The TVS diode is similar to zener diode, and is used as a semiconductor device to protect sensitive electronic equipment from excessively high voltage. Namely, the TVS diode is a device to prevent a feeble circuit from reaching a state of excessively high voltage caused in electrostatic discharge (ESD) in inductive load switching, or in induced lightning. When stress such as ESD is flowed in the gate input lead 12, 13, the current path is bypassed from the gate input lead 12, 13 to the direction of the source input lead 11, 14. Therefore, the gate electrodes G1, G2 are protected. Also, it is possible to place a consistent resistor 15, 17 between the gate input lead 12, 13 and the gate electrode G1, G2 to protect the gate electrode G1, G2 from the flow of stress current such as ESD in the gate input lead 12, 13. The flow of ESD stress to the gate electrode G1, G2 is prevented by increasing resistance in the block just before the gate electrode G1, G2. The resistor 15, 17 may be formed using poly silicon, which is non-silicide, to increase resistance.

Figure 2:
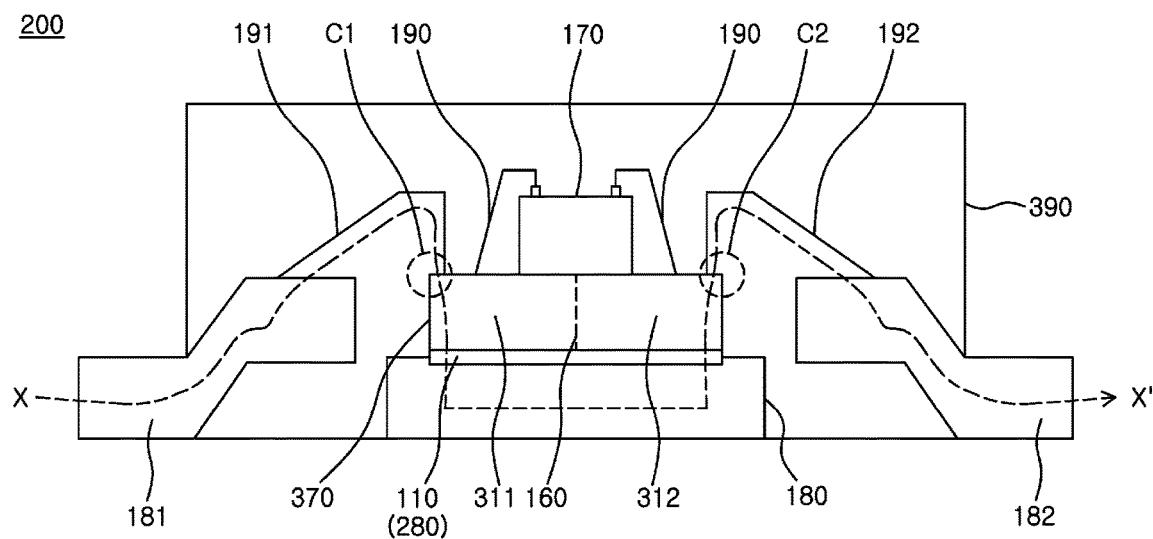
FIG. 2 is a rough cross-sectional view of a wafer-level chip-scale package including a power semiconductor, according to an embodiment.

FIG. 2 illustrates the wafer-level-chip scale package 200, according to an embodiment. The wafer-level-chip scale package 200 includes, as a single package, the power semiconductor 370 including the first semiconductor device 311 and the second semiconductor device 312, and a semiconductor device 170 configured to control the gate. The power semiconductor 370 has the dual n-channel configuration, as described above with respect to FIG. 1. The wafer-level-chip scale package 200 includes packaging 390 to fix the components of the wafer-level-chip scale package 200. The packaging 390 may be constructed of a molding compound including a ceramic material, a metal material, a plastic material, an epoxy resin, or an inorganic material such as silica and epoxy molding compound (EMC), with various secondary materials such as any one or any combination of any two or more of a stern material, a noninflammable material, or a parting agent.

Still referring to FIG. 2, the power semiconductor 370 is disposed on a bottom lead frame 180, and the semiconductor device 170 for controlling the gate is disposed on the power semiconductor device 370 in the form of a stack. The gate electrode G1, G2 and the source electrode S1, S2 (FIG. 1) are formed on the upper side of the power semiconductor 370. Further, a back metal layer 110, which is used for the common drain electrode 280, is formed on the bottom part of the power semiconductor 370. A nickel-vanadium/silver (NiV/Ag) metal may be used for the back metal layer 110. Also, a titanium/silver (Ti/Ag) or aluminum/titanium/silver (Al/Ti/Ag) metal may be used. Further, the bottom lead frame 180 may be constructed of copper (Cu), and is located in direct connection with the back metal layer 110. Therefore, the bottom lead frame 180 is electronically connected to each drain electrode formed on the bottom of the power semiconductor 370.

Since the resistance of the back metal layer 110 used as the common drain electrode 280 is higher than the resistance of the bottom lead frame 180, the bottom lead frame 180, which is formed of a Cu material, is added to lower the resistance of the common drain electrode 280. The thickness of the bottom lead frame 180 is far greater than the thickness of the common drain electrode 280, which contributes to lowering the resistance of the common drain electrode 280. Accordingly, a drawback is that the package 200 is very thick.

Also, the first semiconductor device 311 and a first lead frame 181 are electrically connected by wire bonding 191 on a first contact site C1. Further, the second semiconductor device 312 and a second lead frame 182 are electrically connected by wire bonding 192 on a second contact site C2. Accordingly, there is the problem of a very high resistance due to the wire bondings 191 and 192. That is, although the resistance between the first contact site C1 and the second contact site C2 is low, there is a problem that on resistance of the entire current path X-X' is very high due to the wire bonding 191 and 192. Therefore, when on resistance is very high, switching loss increases.

It is also possible for the semiconductor device 170 for gate control to be deposited on the upper part of the power semiconductor 370. Bonding of the semiconductor device 170 for gate control to the power semiconductor 370 is implemented by a wire 190 extending between the I/O pad of the semiconductor device 170 for gate control and the power semiconductor 370. A metal having good conductivity, such as Au, Al, or Cu, may be used for the wire 190.

Figure 3:
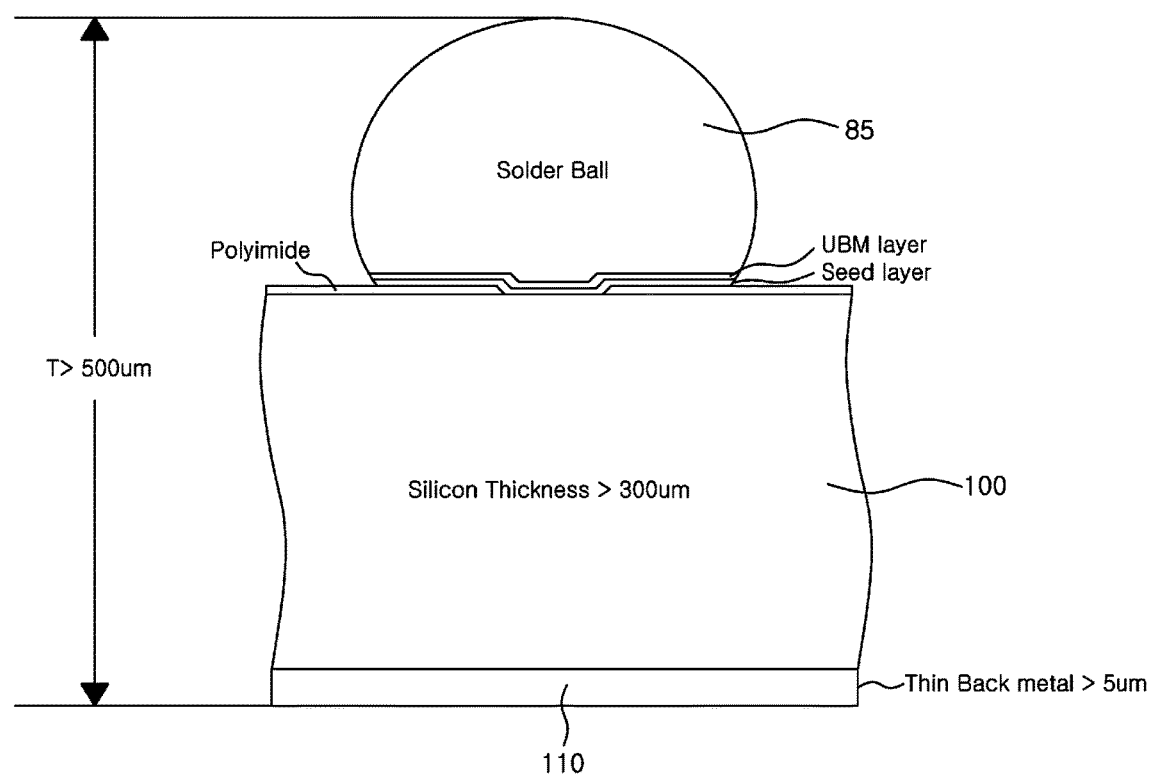
FIG. 3 is an end view of depicting a solder ball formed on a surface of a silicon substrate of a wafer-level chip-scale package, according to an embodiment.

FIG. 3 illustrates the entire thickness of a wafer-level chip-scale package, according to an embodiment. Since a bump is formed by a solder ball 85 having a thickness of more than 200 um, and the thickness of a silicon semiconductor substrate 100 is more than 300 um, the thickness of the entire package is greater than 500 um. The solder ball 85 connects the semiconductor substrate 100 and a main PCB to each other. Accordingly, is difficult to minimize the size of the package. Therefore, to reduce the resistance caused by the wire bonding and to lower the overall thickness of the package, in an embodiment, a wafer-level chip-scale package 400 has the structure illustrated in FIG. 4, as described below.

Figure 4:
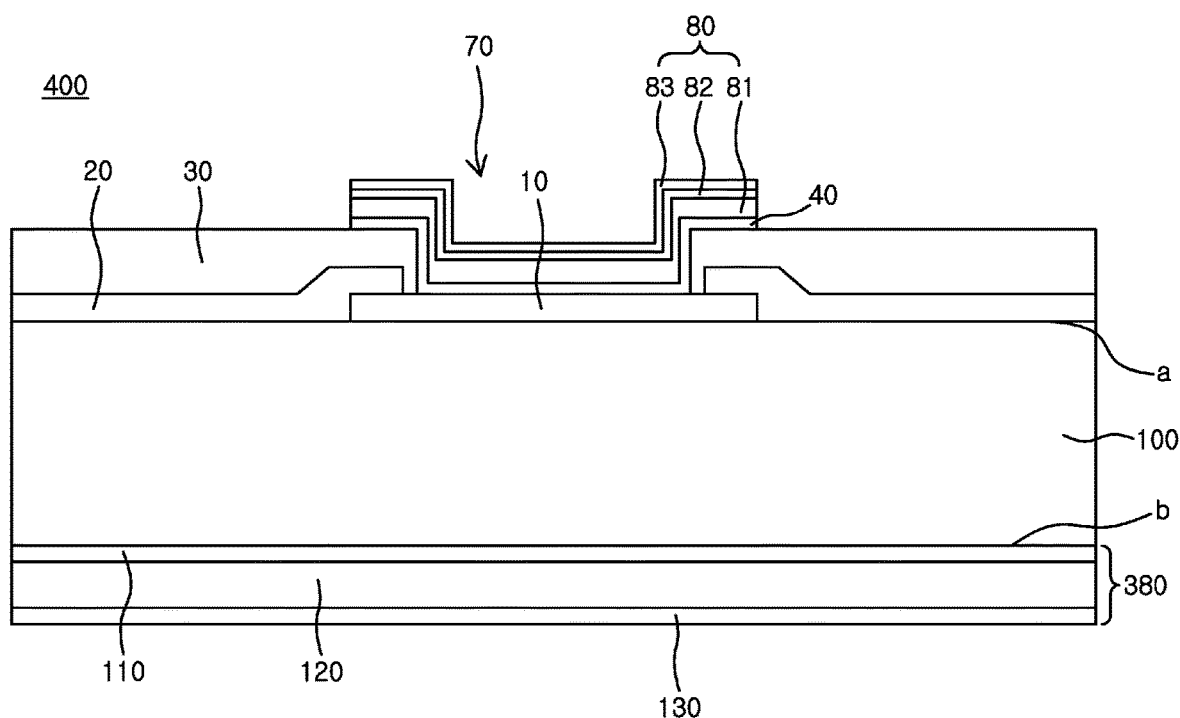
FIG. 4 is an end view of a wafer-level chip-scale package including a power semiconductor, according to another embodiment.

FIG. 4 is a drawing of the wafer-level chip-scale package 400, according to an embodiment. In particular, FIG. 4 shows a detailed view of a structure of a metal bump 70 and a common drain electrode 380.

The metal bump 70 is connected to an I/O pad 10, which is formed on a surface a of the semiconductor substrate 100 and can be a source electrode pad or a gate electrode pad. FIG. 4 shows that a trench gate is formed on the semiconductor substrate 100. The thickness of the semiconductor substrate 100, according to an embodiment, is less than 140 um (or 100 um). The metal bump 70, which is formed around the I/O pad 10, has a solderable metal layer structure 80 instead of the solder ball 85 illustrated in FIG. 2.

The I/O pad 10 may be generally composed of Al or Cu. For example, the solderable metal layer structure 80 includes a first solderable layer 81, a second solderable layer 82, and a third solderable layer 83, and may be deposited in the order of the first solderable layer 81, the second solderable layer 82, and the third solderable layer 83, in the direction upward from the I/O pad 10. The first solderable layer 81 may be composed of Cu. The second solderable layer 82 may be composed of Ni. The third solderable layer 83 may be composed of Au. However, the first solderable layer 81 is optional, and therefore may not be deposited. Alternatively, instead of Cu, another metal with good conductivity may be used for the first solderable layer 81. In an example, the first solderable (Cu) layer 81 is 5 um thick, the second solderable (Ni) layer is 2 um thick, and the third solderable (Au) layer is 0.5 um thick.

As illustrated in FIG. 4, the common drain electrode 380 is formed on an opposite side b of the semiconductor substrate 100. The common drain electrode 380 includes a first metal layer 120 and the second metal layer 130. The first metal layer 120 may be constructed of Cu or Ag, and the second metal layer 130 may be composed of Ni. The first metal layer 120 may form the electrical path in the common drain electrode 380. According to circumstances, the common drain electrode 380 may include the back metal layer 110, the first metal layer 120 and the second metal layer 130. The first metal layer 120 and the second metal layer 130 are formed on the bottom of the back metal layer 110. It is possible to reduce the resistance of the drain electrode by forming the common drain electrode 380 to have a thickness of about 5 um to about 30 um.

Thus, the common drain electrode 380 differs from the common drain electrode 280 in FIG. 3, which includes only the thin back metal layer 110, in that the common drain electrode 380 includes the first metal layer 120 and the second metal layer 130. Therefore, the common drain electrode 380 is far thicker than the common drain electrode 280, and the resistance of the common drain electrode 380 is less than the resistance of the common drain electrode 280.

Other metals with great conductivity may be used for the first metal layer 120, instead of Cu or Ag. Also, it is possible to deposit the second metal layer 130 on the bottom of the first metal layer 120 in order to prevent oxidation of the first metal layer and to guarantee a high visibility laser marking in the case of laser marking of the common drain electrode 380. The second metal layer 130 may include Ni, but other metals may also be used within the constraint of maintaining visibility of a laser marking. The metal second layer 130 may be formed as a thin layer within the constraint of realizing prevention of oxidation of the first metal layer 120. In an example, the thickness of the second metal layer 130 is about 2 um.

Additionally a protection layer or a passivation layer 20 is disposed on the surface a of the semiconductor substrate 100 to protect the integrated circuits formed on the semiconductor substrate from external air and moisture. A silicon nitride may be used for the passivation layer 20. The passivation layer 20 is overlapped on the I/O pad 10. Additionally, a polyimide layer 30 is formed on the passivation layer 20 in order to facilitate the formation of the metal bump 70.

Figure 5:
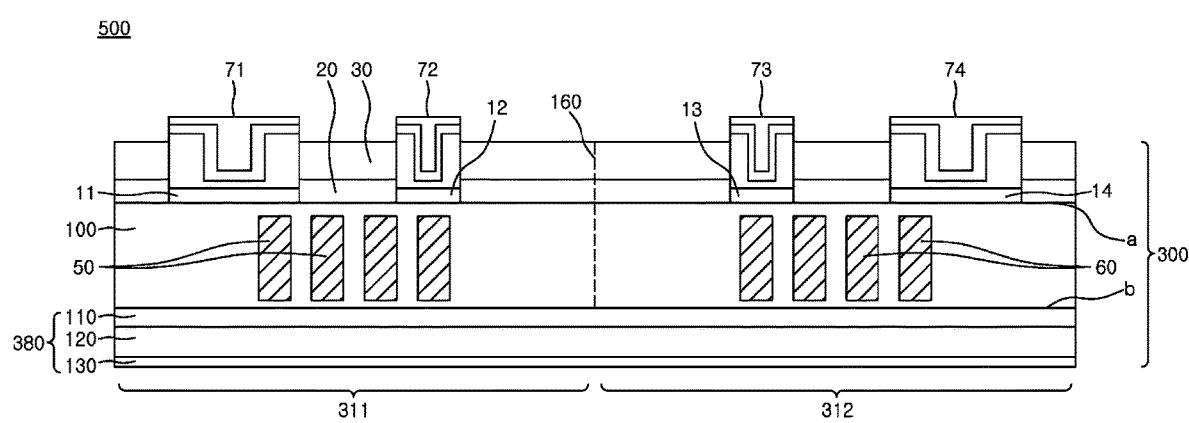
FIG. 5 is a detailed view of a wafer-level chip-scale package including a power semiconductor, according to another embodiment.

FIG. 5 is a detailed drawing of a wafer-level chip-scale package 500, according to another embodiment. The wafer-level chip-scale package 500 includes a power semiconductor die 300 including the power semiconductor 370, which is an IC power device having a dual n-channel. As mentioned above, the power semiconductor 370 includes the first and second semiconductor devices 311 and 312 formed inside the semiconductor substrate 100. The first and second semiconductor devices 311 and 312 utilize trench gate structures 50 and 60, respectively. However, the semiconductor devices 311 and 312 are not restricted to the trench MOSFET devices, and any semiconductor device that may be used for a vertical MOSFET device that forms a vertical channel may be suitable. For instance, an insulated-gate bipolar transistor (IGBT) device may be used.

Additionally, first and second source electrode pads 11 and 14, and first and second gate electrode pads 12 and 13 are formed on the surface a of the semiconductor substrate 100. The trench gates 50 are formed separately on the first semiconductor device 311 and are electrically connected to the first gate electrode pad 12. Also the first source electrode pad 11 is electrically connected to an area of a first source (not illustrated). The second semiconductor device 312 is formed to have a structure similar to that of the first semiconductor device 311. That is, trench gates 60 are formed separately on the second semiconductor device 312 and are electrically connected to the second gate electrode pad 13. Also the second source electrode pad 14 is electrically connected to an area of the second source (not illustrated).

Bumps 71-74 are formed in an array to match with the electrode pads 11-14, respectively, in one-on-one relationship. Thus, the first source electrode pad 11 is electrically connected to the first source bump 71, and the second source electrode pad 14 is electrically connected to the second source bump 74. The first gate electrode pad 12 is electrically connected to the first gate bump 72, and the second gate electrode pad 13 is electrically connected to the second gate bump 73. The bumps 71-74 may have a construction similar to that of the metal bump 70 of FIG. 4 described above.

The configuration of the electrode pads 11-14 is distinct in that the first source electrode pad 11 and the second source electrode pad 14 are physically separated from each other, and the first gate electrode pad 12 and the second gate pad 13 are physically separated from each other. As illustrated in the FIG. 5, it is possible to make the size of the source electrode pads 11 and 14 much larger than a size of the gate electrode pads 12 and 13, in order to reduce the resistance of the entire path X-X' by reducing the resistance of the source electrode pads 11 and 14.

Figure 6A:
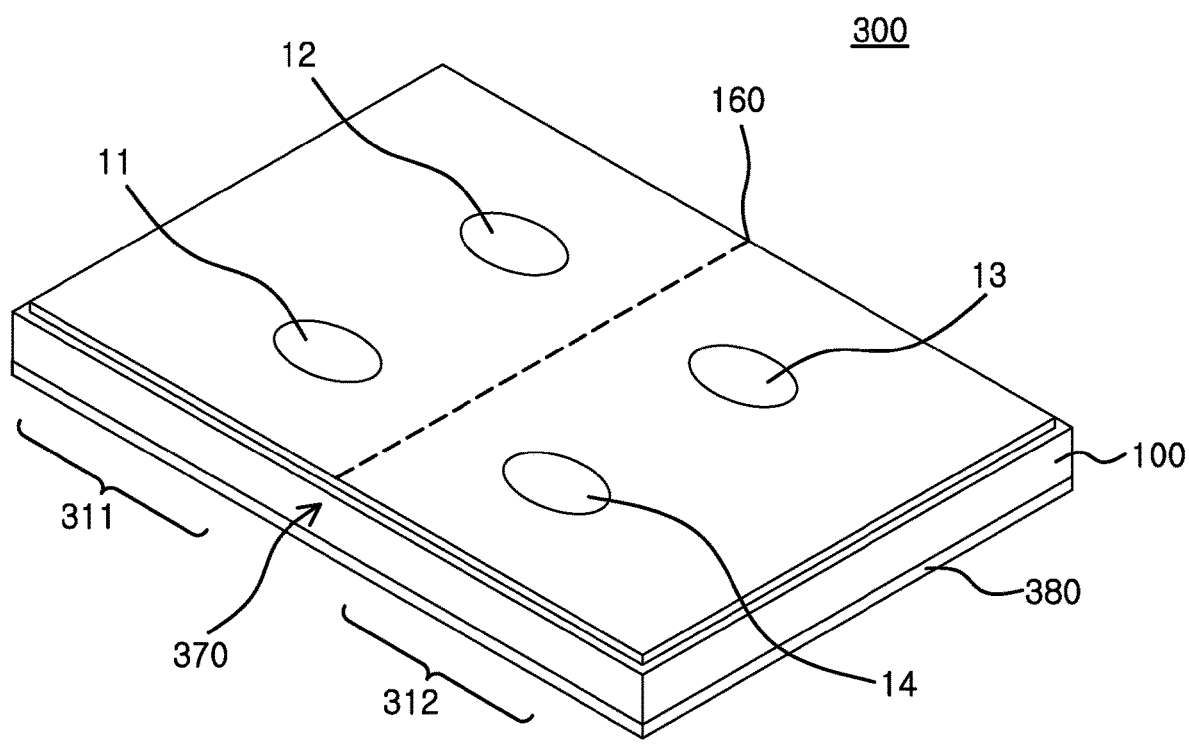
FIG. 6A is an oblique plan view of a power semiconductor die of FIG. 5, according to an embodiment.
Figure 6B:
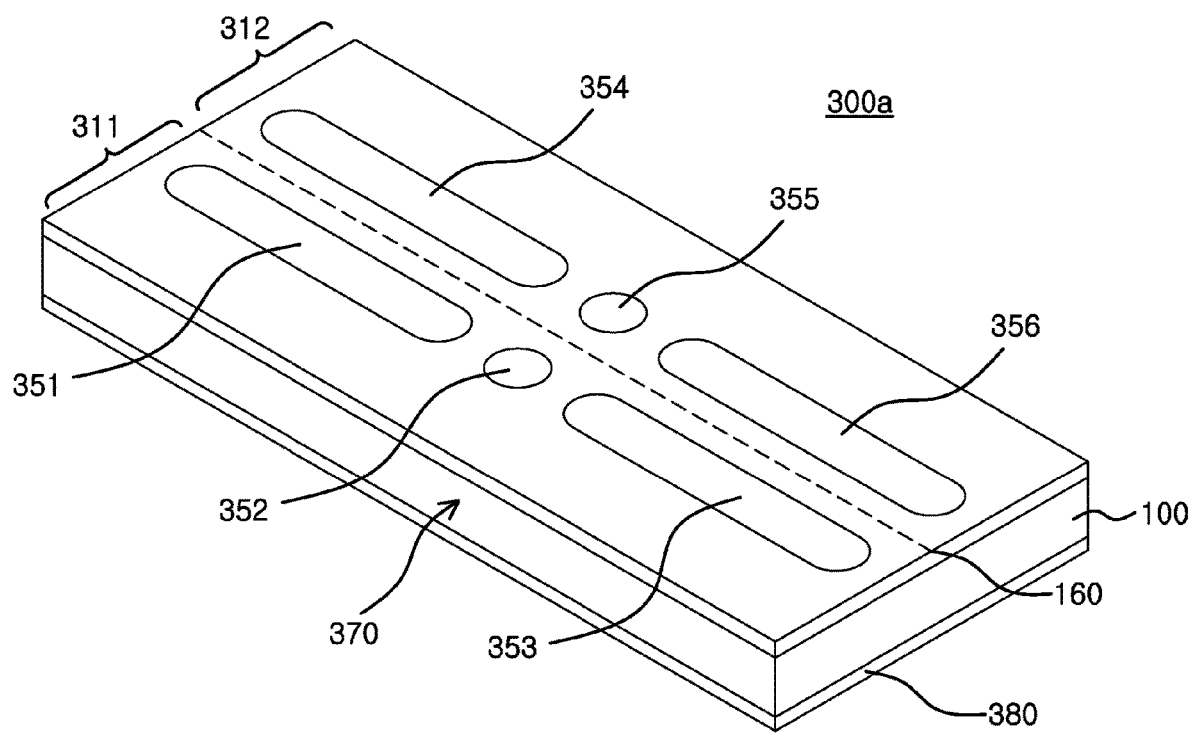
FIG. 6B is an oblique plan view of a power semiconductor die, according to another embodiment.

FIGS. 6A and 6B are top plan perspective views of power semiconductor die 300 and 300a, respectively, including the power semiconductor 370 depicted on FIG. 5, according to embodiments.

FIG. 6A illustrates the semiconductor die 300, according to an embodiment, which includes the semiconductor substrate 100 having the virtual reference plane 160. The first and second trench semiconductor devices 311 and 312 are formed side-by-side in the semiconductor die 300, and are physically separated along the virtual reference plane 160. The first source electrode pad 11 and the first gate electrode pad 12 are formed on an upper side of the first semiconductor device 311. The second source electrode pad 14 and the second gate electrode pad 13 are formed on an upper side of the second semiconductor device 312. The first and second source electrode pads 11 and 14 and the first and second gate electrode pads 12 and 13 are physically separated from each other. The size of the first and second source electrode pads 11 and 14 may be similar to the size of the first and second gate electrode pads 12 and 13. However, it is also possible to make the size of the first and second source electrode pads 11 and 14 much larger than that of the first and second gate electrode pads 12 and 13, in order to reduce the resistance of the first and second source electrode pads 11 and 14. Accordingly, the resistance of the entire path X-X' mentioned above is reduced. Additionally, the common drain electrode 380 is formed on opposite bottom side of the first and second semiconductor devices 311 and 312.

FIG. 6B illustrates a power semiconductor die 300a, according to an embodiment. The power semiconductor die 300a is similar to the power semiconductor die 300, except that the power semiconductor 300a includes first and second source electrode pads 351 and 353 and a first gate electrode pad 352 formed on the first trench semiconductor device 311, and includes third and fourth source electrode pads 354 and 356 and a second gate electrode pad 355 formed on the second semiconductor device 312. Thus, the power semiconductor die 300a differs from the power semiconductor die 300 in FIG. 6A in that the power semiconductor die 300a includes two source electrode pads, instead of one source electrode pad, on each semiconductor device 311, 312. In this configuration, the two source electrode pads 351 and 353 on the first semiconductor device 311 and the third and fourth source electrode pads 354 and 356 are placed to improve the performance of the chip in terms of design. In other words, it is possible to process more signals by using two source electrode pads instead of one source electrode pad. Such a configuration is suitable for a power semiconductor that requires a semiconductor device with high current capacity. It is possible to form the location, size, or shape of each source electrode pad 351, 353, 354 and 356 and gate electrode pad according to the capacity of the power semiconductor 311 or 312.

Figure 7A:
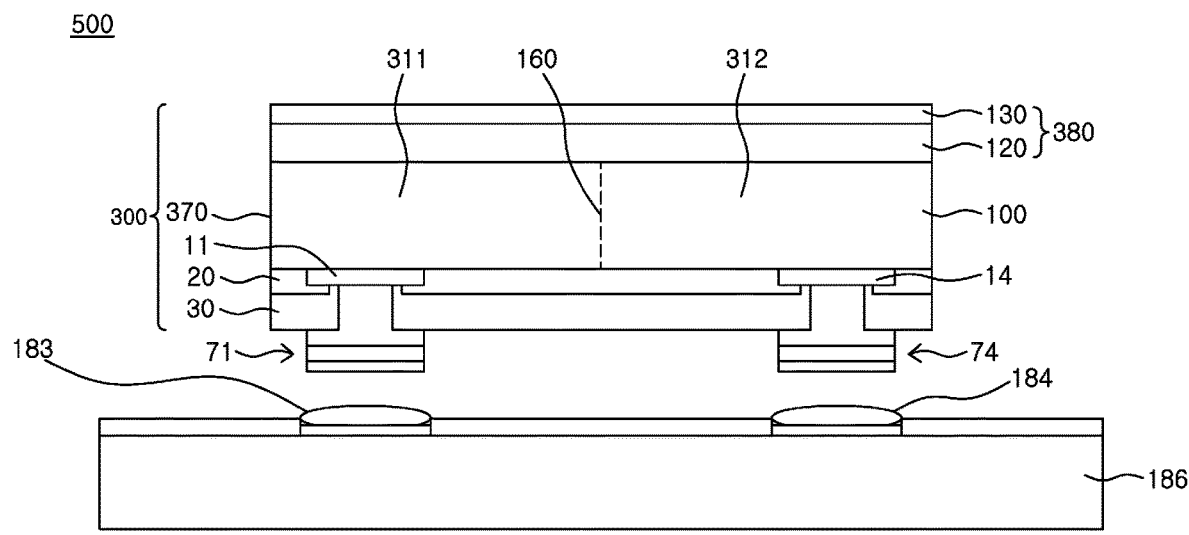
FIGS. 7A and 7B illustrate the wafer-level chip-scale package of FIG. 5 mounted on a printed circuit board, according to an embodiment.
Figure 7B:
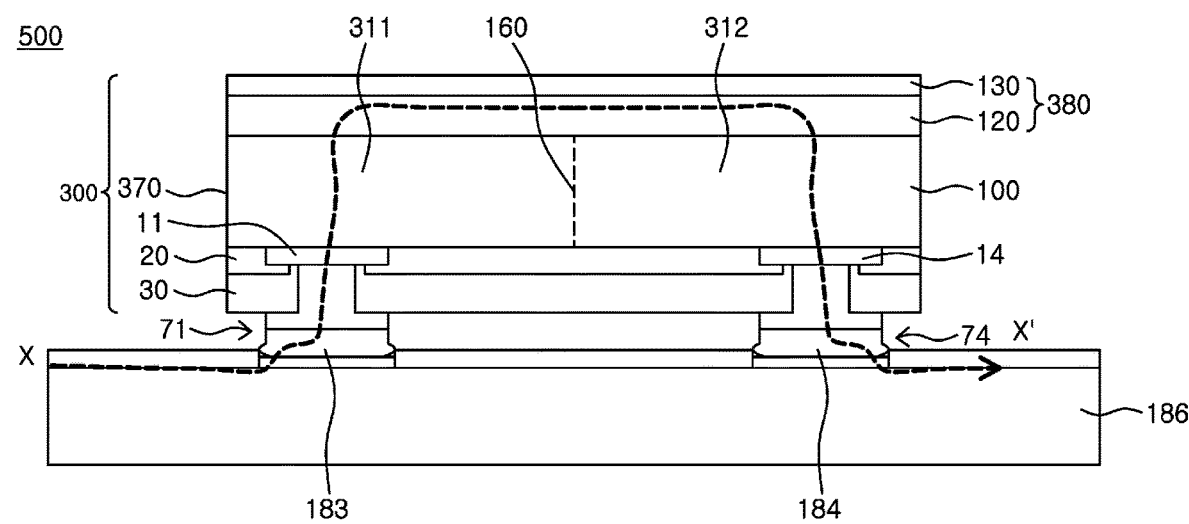

FIGS. 7A and 7B demonstrate the wafer-level-chip scale package 500 illustrated in FIG. 5 being mounted on a printed circuit PCB 186. FIG. 7A shows a phase before mounting of the wafer-level-chip scale package 500, and FIG. 7B shows a phase after mounting of the wafer-level-chip scale package 500. The wafer-level-chip scale package 500 signifies one chip or a form of a die. Two or more power semiconductor devices 311 and 312 are mounted or formed on the single semiconductor substrate 100 of the power semiconductor 370. The power semiconductor 370 does not contain two semiconductor chips, but the two semiconductor devices 311 and 312 are formed on one chip or die 300. As described above, each semiconductor device 311 and 312 may have an n-channel or p-channel. In the case of an n-channel, as described herein, the power semiconductor 370 is equipped with the first and second, dual n-channel semiconductor devices 311 and 312. The first and second semiconductor devices 311 and 312 are designed to have current flow in two directions for the purpose of lengthening the lifespan of a battery and efficiency of mobile equipment, as explained above with respect to FIG. 1. The first and second semiconductor devices 311 and 312 are designed to pick one particular direction of current flow among two directions. The first and second semiconductor devices 311 and 312 are designed to have current flow in an opposite direction after a specified period of time.

As illustrated in FIGS. 7A and 7B, the wafer-level chip-scale package 500 is in the form of flip-chip, and the common drain electrode 380 is formed on a rear side of the power semiconductor 370. The common drain electrode 380 functions as a bottom lead frame. The first source electrode pad 11 and the second source electrode pad 14 are formed on the upper side of the power semiconductor 370. The first and the second gate electrode pads are omitted in this example because of limited space. The first and second bumps 71 and 74 formed on the semiconductor substrate 100 correspond one-to-one on the first and second source electrode pads 11 and 14. The first bump 71 is electrically connected to an I/O terminal 183 of the PCB 186. The second bump 74 is electrically connected to an I/O terminal 184 of the PCB 186.

As illustrated in the FIG. 7B, the first and second bumps 71 and 74 are directly connected to the I/O terminals 183 and 184. Therefore, the resistance is kept low in the entire current path X-X'. Therefore, the structure depicted in FIG. 7B has a low resistance of the entire current path X-X' in comparison to the package 200 depicted in FIG. 2.

FIG. 8 illustrates a method of manufacturing the wafer-level chip-scale package 500, according to an embodiment. The structure of the trench gates 50 and 60 is omitted in FIG. 8. In the manufacturing process, the back side grinding technology is applied to reduce the thickness of the semiconductor substrate 100.

Figure 8A:
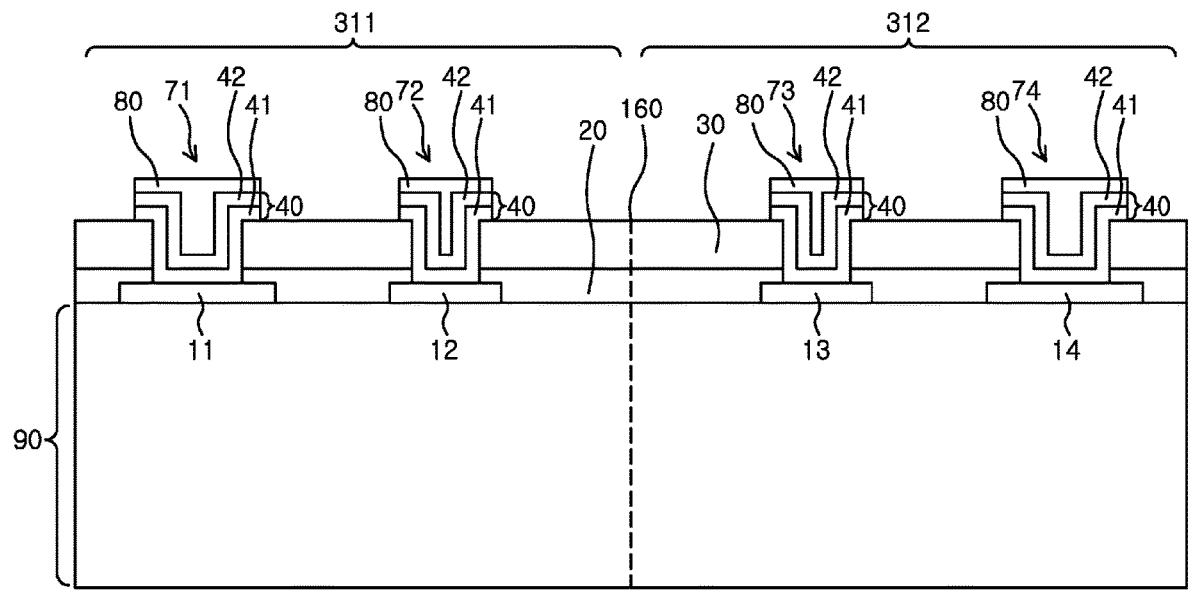
FIGS. 8A-8F illustrate stages of a method of manufacturing the wafer-level chip-scale package, according to an embodiment.

As illustrated in FIG. 8A, the method of manufacturing the wafer-level chip-scale package 500 begins preparation of a silicon semiconductor substrate 90. The allotted integrated circuits illustrated in FIG. 1 are formed on the silicon semiconductor substrate 90. The semiconductor device 311 and 312 that are divided by the virtual reference plane 160 are included. The integrated circuits (not illustrated) formed on the semiconductor substrate are formed on the first and the second semiconductor devices 311 and 312. The I/O pads 11-14 are generally formed of aluminum. Each of the I/O pads 11-14 serve as a source electrode pad or a gate electrode pad.

The passivation layer 20 is deposited on the substrate 90 to protect the integrated circuits (not illustrated) formed on the semiconductor substrate 90 from external air or moisture. The passivation layer 20 may include a silicon nitride layer. The passivation layer 20 is formed to overlap on the I/O pads 11-14. Also, the polyimide layer 30 is formed on the passivation layer 20 in order to facilitate the formation of the metal bumps 71-74 that are respectively connected to the I/O pads 11-14.

A part of the polyimide layer 30 is selectively eliminated in order to form the metal bumps 71-74. To improve the adhesion of the I/O pads 11-14 and the metal bumps 71-74, a seed metal 40 is deposited on the pads 11-14 and portions of the polyimide layer 30. The seed metal 40 includes, for example, a Ti layer 41 and a Cu layer 42. The seed metal 40 may be deposited by a sputtering method, however other methods of depositing the seed metal 40 are possible.

The I/O pads 11-14 are exposed by performing photoresist patterning on the upper surface of the semiconductor substrate 90. The metal bumps 71-74 are formed on the upper surface of the exposed I/O pads 11-14. The metal bumps 71-74 are composed of the solderable metal layer 80 in order to reduce the total thickness of the package 500. For example, as depicted in FIG. 4, the solderable metal layer 80 includes the first solderable (Cu) layer 81, the second solderable layer (Ni) 82, and the third solderable layer (Ag) 83. However, any metal with good conductivity may be used instead of Cu. The first solderable (Cu) layer 81, the second solderable layer (Ni) 82, and the third solderable layer (Ag) 83 are deposited first, second and third, respectively, from bottom to top, on the pads 11-14. The metal bumps 71-74 are formed to be physically separated from each other by eliminating photoresist patterning and the seed metal layer 40 deposited on a part excluding the metal bumps 71-74.

Figure 8B:
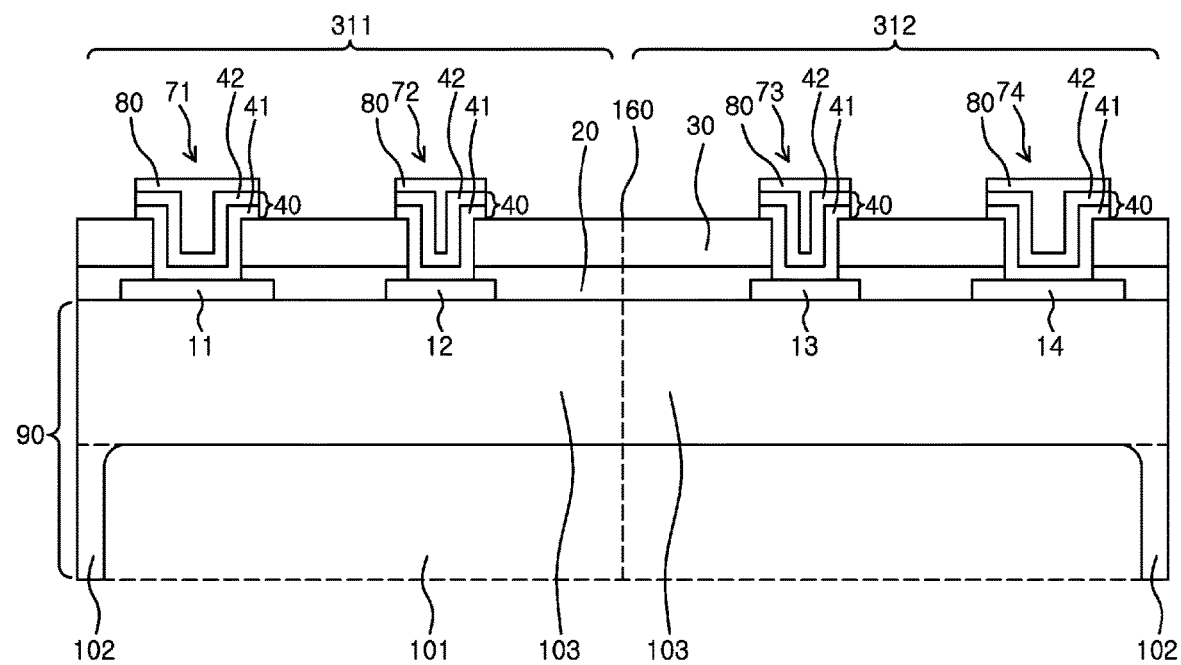

As illustrated in FIG. 8B, a process of polishing the bottom of the semiconductor substrate 90 is performed. In the polishing process, a first area 101 in the center of the semiconductor substrate 90 is selectively polished. By selectively polishing the first area 101, a recessed region 103 is formed, and a rim 102 surrounding the first area 101 is formed. Since there is a possibility of warpage and damage in the test process depicted in FIG. 8D, and in the case of handling other semiconductor substrates when polishing an entire area of the bottom of the semiconductor substrate, it is advantageous to polish the first area 101 only. The first area 101 occupies much more space in comparison to the rim 102. The thickness of the semiconductor substrate 90 in the recessed region 103 produced by the selective polishing process may be about 50 um to about 100 um. It is permissible to polish the semiconductor substrate to provide a recessed region 103 that is thinner than 50 um if the driving of the semiconductor device is good and technology allows. The polishing of the first area 101 to produce the recessed region 103 may include mechanical polishing by a grinder, chemical mechanical polishing (CMP), wet etching, or dry etching.

Figure 8C:
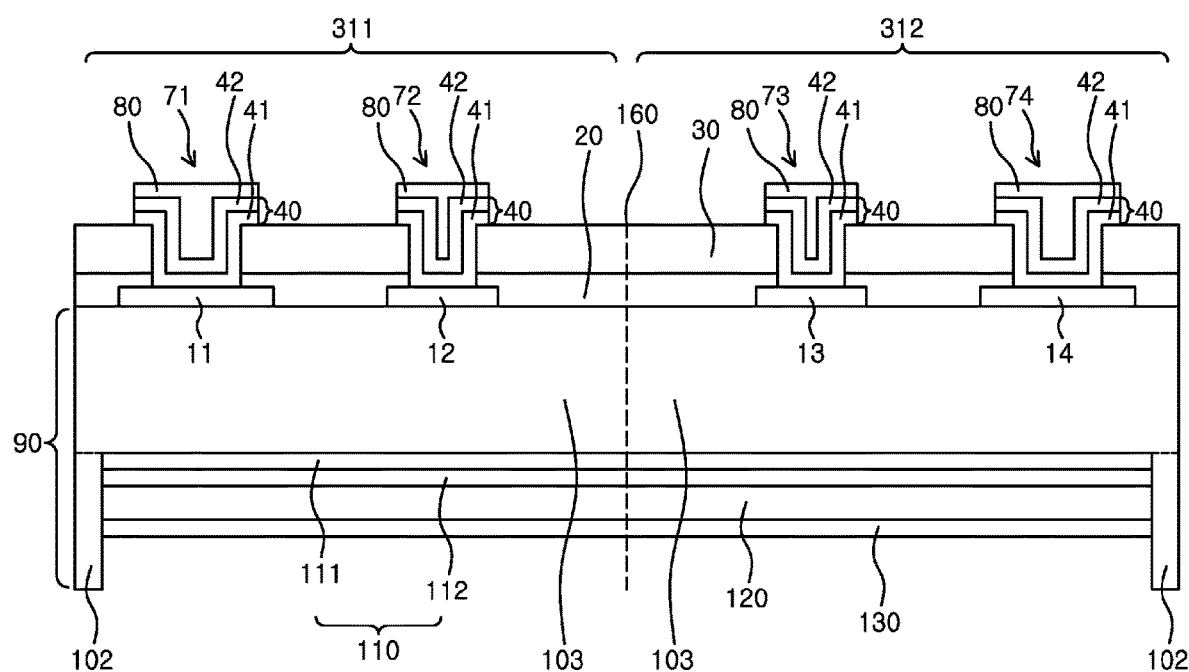

As illustrated in FIG. 8C, a sputter metal layer 111 and the back metal layer 110 including an oxidation preventive layer 112 are formed on the bottom of the semiconductor substrate 90, of which only the first area 101 is polished. The oxidation preventive layer 112 is formed on the surface of the sputter metal layer 111. NiV may be used for the sputter metal layer 111, and the sputter metal layer may be formed by a sputtering method. The oxidation preventive layer 112 may include Ag. Next, the first metal layer 120, which has a low resistance, is deposited by electroplating. It is desirable to form the first metal layer 120 to have a thickness between about 5 um and about 30 um to lower on resistance. The first metal layer 120 forms the electrical path of the common drain electrode 380. Cu or Ag may be used for the first metal layer 120, however, another metal with good conductivity may be used. The second metal layer 130 may also be deposited by electroplating. The second metal layer 130 functions to prevent the oxidation of the first metal layer 120 and to improve the visibility of laser marking. Laser marking is, for example, a process of carving the information of goods on each individual product. The second metal layer 130 may include Ni, but other metals may be used within the constraint of retaining the visibility of laser marking. The second metal layer may have a thin form as long as it is capable of preventing the oxidation of the first metal layer 120. For example, the thickness of is the first metal layer 120 is between 0.2 um and 5 um.

It is advantageous for relieving stress to deposit the first and second metal layers 120 and 130 while the rim or edge area 102 remains. This is because the rim 102 absorbs the high level of tensile or compressive stress generated in the process of depositing the first and second metal layers 120 and 130. Thus, the above-described process of polishing the bottom of the semiconductor substrate 90 as the effect of preventing warpage and damage of the semiconductor substrate 90. The polishing process therefore reduces the possibility of damage by wafer handling.

Figure 8D:
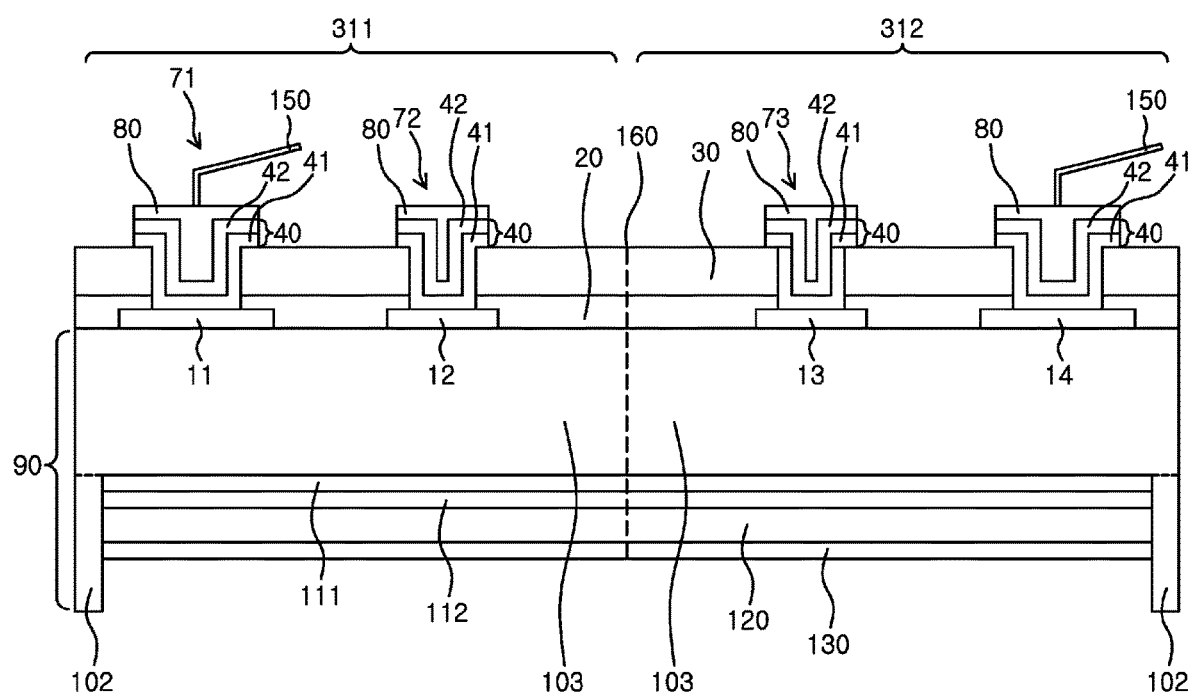

After the process of depositing the second metal layer 130 on the bottom of the semiconductor substrate 90, the test process is performed by the tester 150 for the purpose of checking the quality of each semiconductor device, as illustrated in FIG. 8D. More specifically, after depositing the first metal layer 120 and the second metal layer 130 in order on the surface of the recess area 103, the test process is performed without eliminating the rim 102 from the bottom of the semiconductor substrate 90.

Figure 8E:
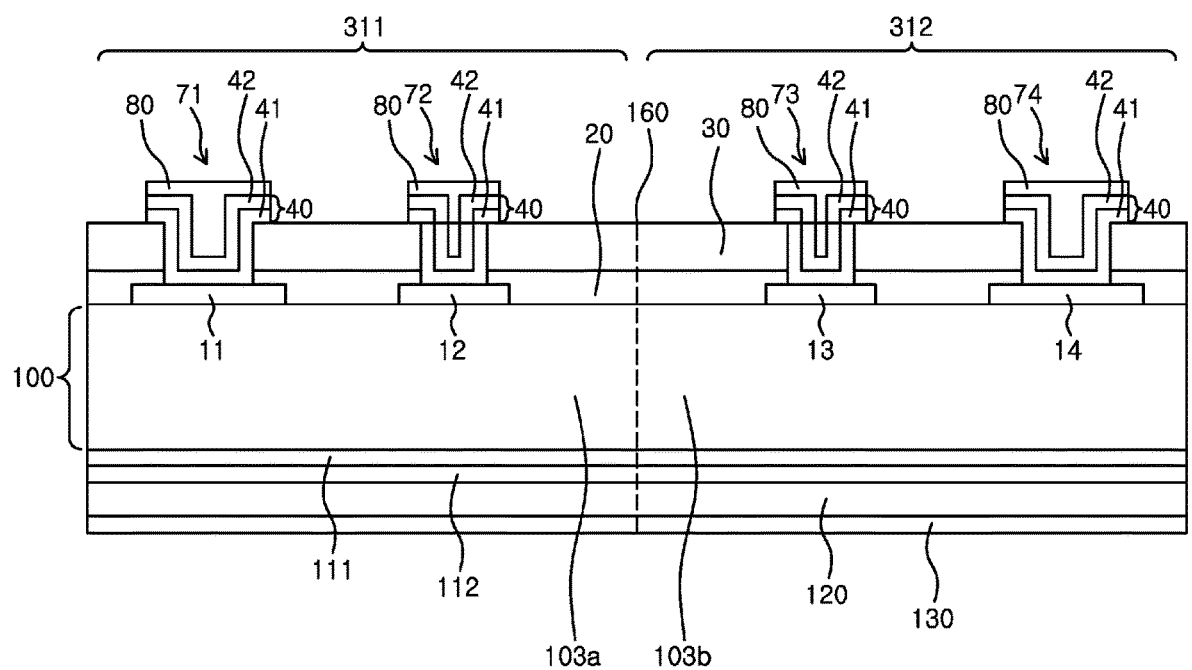

Next, as illustrated in FIG. 8E, after the testing of the power semiconductor device 370 is complete, a process of trimming the rim 102 is performed. Specifically, the rim 102 may be trimmed so that the semiconductor substrate 90 does not extend below the common drain electrode 380. As a result, the semiconductor substrate 100 having a thickness less than 100 um is formed.

Figure 8F:
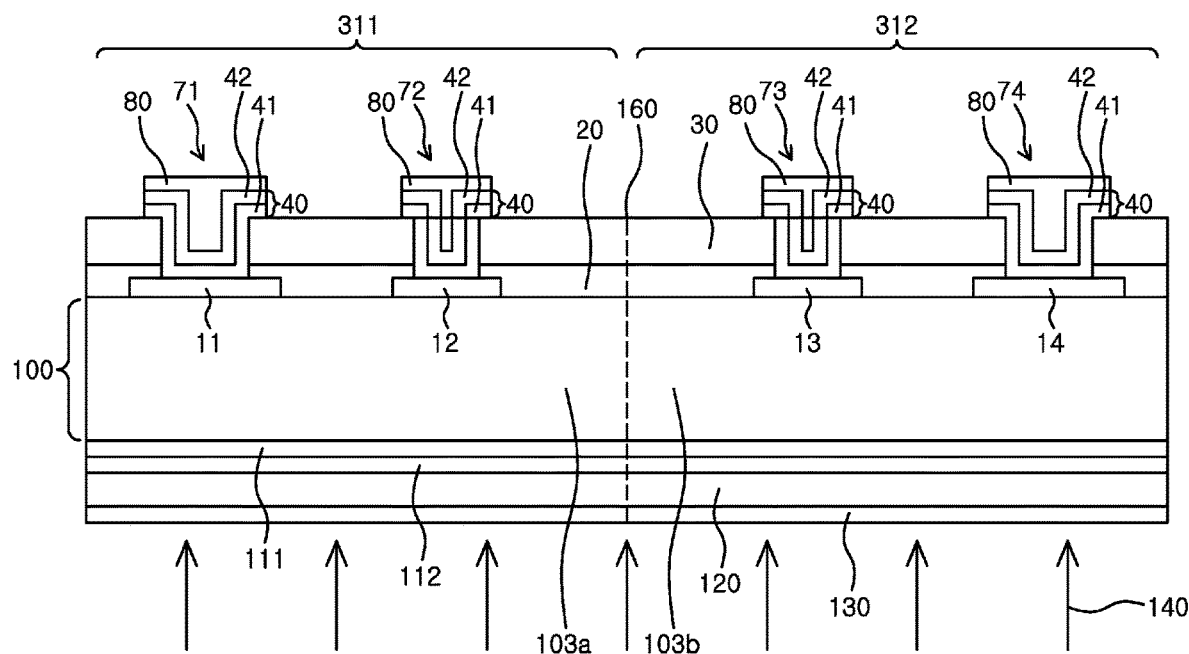

Next, as illustrated in FIG. 8F, the laser marking process including marking by laser 140 on the exposed surface of the second metal layer 130 is performed. Other methods of marking on the second metal layer 130 may also be used. Next a process of separation into each individual chip-scale package 500 is performed. Two semiconductor devices 311 and 312 are included in individual chips.

Next, an explanation of the warpage of a wafer, according to an embodiment, will be provided. The permissible range of the warpage of a wafer is below 3 mm. In case of grinding the rear part of the wafer, without the formation of the rim 102, and mounting the back metal layer 110, the first metal layer 120, and the second metal layer 130, the measured value of the warpage was between 5 mm and 5.2 mm, which is beyond the permissible range. The stack structure of the first and the second metal layers 120 and 130 usually generates the warpage. However, in a wafer formed by a process according to an embodiment disclosed herein, warpage of wafer rarely occurred. Namely, when the common drain electrode 380 was formed in the recess area 101 while rim 102 was formed, the warpage of semiconductor substrate 100 was between 0 mm and 0.2 mm, which is well within the permissible range. When the first and the second metal layers 120 and 130, which are thick, are deposited while rim 102 remains after the grinding of the back side of the wafer, the rim 102 absorbs stress caused by the depositing of the first and second metal layers 120 and 130, thereby resulting in the warpage resistance of the wafer. This is because the strength of the wafer has been maintained after the elimination of the wafer edge. It is very advantageous for wafer handling to minimize warpage of the wafer. This is because wafer handling becomes difficult and there might be the problem of wafer damage as the warpage becomes sever.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a wafer-level chip-scale package, the method comprising:
    forming a power semiconductor device comprising a first semiconductor device and a second semiconductor device electrically connected to the first semiconductor device on a semiconductor substrate;
    forming a first source metal bump and a first gate metal bump on the first semiconductor device, and forming a second source metal bump and a second gate metal bump on the second semiconductor device of the power semiconductor;
    forming a recessed area and a rim disposed around the recessed area by polishing a bottom of the semiconductor substrate;
    depositing a back metal layer comprising nickel-vanadium on the recessed area;
    forming a common drain electrode, connected to the first semiconductor device and the second semiconductor device, by depositing a first metal layer comprising copper or silver on the recessed area and a second metal layer comprising nickel on the first metal layer; and
    flattening the bottom of the semiconductor substrate by trimming the rim.

2. The method of claim 1, further comprising testing the power semiconductor device before the trimming of the rim.

3. The method of claim 1, wherein the back metal layer is formed on the recessed area before the first metal layer is deposited on the recessed area.

4. The method of claim 1, wherein a thickness of the first metal layer comprising copper or silver is greater than a thickness of the second metal layer comprising nickel.

5. A method of manufacturing a wafer-level chip-scale package, the method comprising:
    forming a power semiconductor device comprising a first semiconductor device and a second semiconductor device electrically connected to the first semiconductor device on a substrate;
    forming first source metal and gate metal bumps on the first semiconductor device and second source metal and gate metal bumps on the second semiconductor device, respectively;
    forming a recessed area on a bottom surface of the substrate and a rim surrounding the recessed area, by polishing the bottom surface;
    depositing a back metal layer on the recessed area; and
    forming a common drain electrode, connected to the first semiconductor device and the second semiconductor device, by depositing a first metal layer on the recessed area and a second metal layer on the first metal layer,
    wherein the back metal layer comprises nickel-vanadium, the first metal layer comprises copper or silver, and the second metal layer comprises nickel.

6. The method of claim 5, wherein the back metal layer is formed on the recessed area prior to the depositing of the first metal layer on the recessed area.

7. The method of claim 5, further comprising forming a first source metal bump and a first gate metal bump on the first semiconductor device, and forming a second source metal bump and a second gate metal bump on the second semiconductor device.

8. The method of claim 5, wherein a thickness of the first metal layer comprising copper or silver is greater than a thickness of the second metal layer comprising nickel.

9. A method of manufacturing a wafer-level chip-scale package, the method comprising:
    forming a power semiconductor device comprising a first device and a second device electrically connected to the first device on a substrate;
    forming a recessed area on a bottom surface of the substrate and a rim surrounding the recessed area by polishing the bottom surface; and
    forming a common drain electrode on the recessed area, wherein the common drain electrode is connected to the first device and the second device, and comprises nickel-vanadium, copper or silver, and nickel, and wherein the nickel-vanadium is deposited by a sputtering method, and the copper or silver is deposited by an electroplating method.

10. The method of claim 9, wherein a thickness of the copper or silver is greater than a thickness of the nickel.

* * * * *